(12) United States Patent
Lee et al.

(10) Patent No.: US 10,204,825 B2
(45) Date of Patent: Feb. 12, 2019

(54) SEMICONDUCTOR DEVICE HAVING AIR GAP SPACERS AND METHOD FOR FABRICATING THE SAME

(71) Applicant: SAMSUNG ELECTRONICS CO., LTD., Suwon-si, Gyeonggi-do (KR)

(72) Inventors: Dong Ryul Lee, Suwon-si (KR); Joong Chan Shin, Seoul (KR); Dong Jun Lee, Anyang-si (KR); Ho Ouk Lee, Seoul (KR); Ji Min Choi, Hwaseong-si (KR); Ji Young Kim, Yongin-si (KR); Chan Sic Yoon, Anyang-si (KR); Chang Hyun Cho, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/667,118

(22) Filed: Aug. 2, 2017

(65) Prior Publication Data

US 2018/0158718 A1 Jun. 7, 2018

(30) Foreign Application Priority Data

Dec. 2, 2016 (KR) .......................... 10-2016-0163542

(51) Int. Cl.
*H01L 21/3205* (2006.01)
*H01L 21/764* (2006.01)
(Continued)

(52) U.S. Cl.
CPC ........ *H01L 21/764* (2013.01); *H01L 21/7682* (2013.01); *H01L 21/76897* (2013.01);
(Continued)

(58) Field of Classification Search
None
See application file for complete search history.

(56) References Cited

U.S. PATENT DOCUMENTS 6,638,805 B2 10/2003 Park et al.
6,649,510 B2 * 11/2003 Lee ..................... H01L 21/7688
257/E21.507
(Continued)

FOREIGN PATENT DOCUMENTS

JP 2008-306045 12/2008
KR 10-2014-0038824 3/2014
(Continued)

*Primary Examiner* — Hung Vu
(74) *Attorney, Agent, or Firm* — F. Chau & Associates, LLC

(57) ABSTRACT

A method for fabricating a semiconductor device includes providing a substrate including a cell region including a bit line structure, a bit line spacer and a lower electrode and a peripheral circuit region including first to third impurity regions, forming an interlayer insulating film on the peripheral circuit region, forming a first metal layer on the interlayer insulating film, forming a first trench and a second trench in the first metal layer between the first and second impurity regions, the second trench is disposed between the second and third impurity regions and exposes the interlayer insulating film, forming a first capping pattern on the first trench to form an air gap in the first trench, filling the second trench with a first insulating material, and forming, on the first metal layer, a contact connected to the third impurity region.

20 Claims, 21 Drawing Sheets

(51) Int. Cl.
   *H01L 21/768* (2006.01)
   *H01L 29/06* (2006.01)
   *H01L 29/49* (2006.01)
   *H01L 23/522* (2006.01)

(52) U.S. Cl.
   CPC ........ H01L 23/522 (2013.01); H01L 29/0649 (2013.01); H01L 29/4983 (2013.01)

(56) References Cited

U.S. PATENT DOCUMENTS

| | | |
|---|---|---|
| 6,730,975 B2 | 5/2004 | Park et al. |
| 7,868,376 B2 * | 1/2011 | Aoyama ........... H01L 21/28247 257/324 |
| 8,420,527 B2 * | 4/2013 | Koubuchi ............. G03F 9/7076 438/624 |
| 8,445,349 B2 | 5/2013 | Noda |
| 9,064,731 B2 | 6/2015 | Park |
| 9,123,714 B2 | 9/2015 | Pachamuthu et al. |
| 9,130,013 B2 | 9/2015 | Lee et al. |
| 9,281,361 B2 | 3/2016 | Choi et al. |
| 9,379,004 B1 | 6/2016 | Kwon et al. |
| 9,490,159 B2 | 11/2016 | Lee et al. |
| 9,515,022 B2 | 12/2016 | Kwon et al. |
| 2008/0303066 A1 | 12/2008 | Yonemochi et al. |
| 2011/0309430 A1 * | 12/2011 | Purayath ........... H01L 21/28273 257/321 |
| 2014/0246724 A1 | 9/2014 | Jang et al. |

FOREIGN PATENT DOCUMENTS

| | | |
|---|---|---|
| KR | 10-2014-0109105 | 9/2014 |
| KR | 10-2016-0074306 | 6/2016 |

* cited by examiner

SEMICONDUCTOR DEVICE HAVING AIR GAP SPACERS AND METHOD FOR FABRICATING THE SAME

CROSS-REFERENCE TO RELATED APPLICATION

This application claims priority under 35 U.S.C. § 119 to Korean Patent Application No. 10-2016-0163542, filed on Dec. 2, 2016, in the Korean Intellectual Property Office, the disclosure of which is incorporated by reference herein in its entirety.

TECHNICAL FIELD

The inventive concept relates to a semiconductor device, and more particularly, to a semiconductor device having air gap spacers and a method for fabricating the same.

DISCUSSION OF THE RELATED ART

Recently, semiconductor devices are becoming smaller in size. In addition, the performance of semiconductor devices is increasing. Accordingly, an interval between wiring patterns is being reduced, which may increase parasitic capacitance. By using an air gap, which has a low dielectric constant, as a spacer between wiring patterns, the parasitic capacitance can be reduced.

SUMMARY

According to an exemplary embodiment of the inventive concept, a method for fabricating a semiconductor device includes providing a substrate including a cell region and a peripheral circuit region, wherein the cell region includes a bit line structure, a bit line spacer formed on both sidewalls of the bit line structure and a lower electrode formed on the bit line structure, wherein the peripheral circuit region is disposed at least partially along a border of the cell region, and wherein the peripheral circuit region includes a first impurity region, a second impurity region and a third impurity region, forming an interlayer insulating film on the peripheral circuit region of the substrate, forming a first metal layer on the interlayer insulating film, wherein the first metal layer is connected to the first impurity region, the second impurity region, and the third impurity region, forming a first trench and a second trench in the first metal layer, wherein the first trench is disposed between the first and second impurity regions and exposes the interlayer insulating film, and the second trench is disposed between the second and third impurity regions and exposes the interlayer insulating film, forming a first capping pattern on the first trench, wherein the first capping pattern is spaced apart from a bottom surface of the first trench forming a first air gap in the first trench, filling the second trench with a first insulating material insulating the second and third impurity regions, and forming, on the first metal layer, a contact connected to the third impurity region, wherein the contact is formed at a first side of the second trench. The first trench is formed at a second side of the second trench, the first and second sides of the second trench being opposite to each other.

According to an exemplary embodiment of the inventive concept, a method for fabricating a semiconductor device includes providing a substrate including a cell region and a peripheral circuit region, wherein the cell region includes a bit line structure, a bit line spacer formed on both sidewalls of the bit line structure and a lower electrode formed on the bit line structure, wherein the peripheral circuit region is disposed at least partially along a border of the cell region, and wherein the peripheral circuit region includes a first impurity region, and a second impurity region therein, forming an interlayer insulating film on the peripheral circuit region of the substrate, forming a first wire pattern connected to the first impurity region and a second wire pattern connected to the second impurity region, the first wire pattern and the second wire pattern being spaced apart from each other on the interlayer insulating film, forming a first trench exposing the interlayer insulating film between the first and second wire patterns, the first trench including a first region and a second region, forming a first capping pattern covering the first region of the first trench, wherein the first capping pattern is spaced apart from a bottom surface of the first trench such that a first air gap is formed in the first region of the first trench, filling the second region of the first trench with a first insulating material, and forming a contact on the second wire pattern, wherein the contact is connected to the second impurity region on a first side of the second region of the first trench. The second region of the first trench is filled with the first insulating material.

According to an exemplary embodiment of the inventive concept, a method for fabricating a semiconductor device includes providing a substrate including a cell region and a peripheral circuit region, wherein the cell region includes a bit line structure, a first bit line spacer and a second bit line spacer formed on opposite sidewalls of the bit line structure, and a first electrode formed on the bit line structure, wherein the peripheral circuit region is disposed at least partially along a border of the cell region, and wherein the peripheral circuit region includes a first impurity region, and a second impurity region therein, forming an interlayer insulating film on the peripheral circuit region of the substrate, forming a first metal layer on the interlayer insulating film, wherein the first metal layer is connected to the first impurity region and the second impurity region, forming a first wire pattern on the interlayer insulating film, the first wire pattern being connected to the first impurity region, forming a second wire pattern on the interlayer insulating film, the second wire pattern being connected to the second impurity region, wherein the first and second wire patterns are spaced apart from each other, forming a first trench between the first and second wire patterns, the first trench exposing the interlayer insulating film, the first trench including a first region and a second region, forming a first capping pattern on the first region of the first trench to cover the first region of the first trench, wherein the first capping pattern is partially inserted at an opening of the first region of the first trench such that an empty space is formed between a bottom surface of the first region of the first trench and the partially inserted first capping pattern, filling the second region of the first trench with a first insulating material, and forming a contact on the second wire pattern, wherein the contact is connected to the second impurity region on a first side of the second region of the first trench. The second region of the first trench is filled with the first insulating material.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
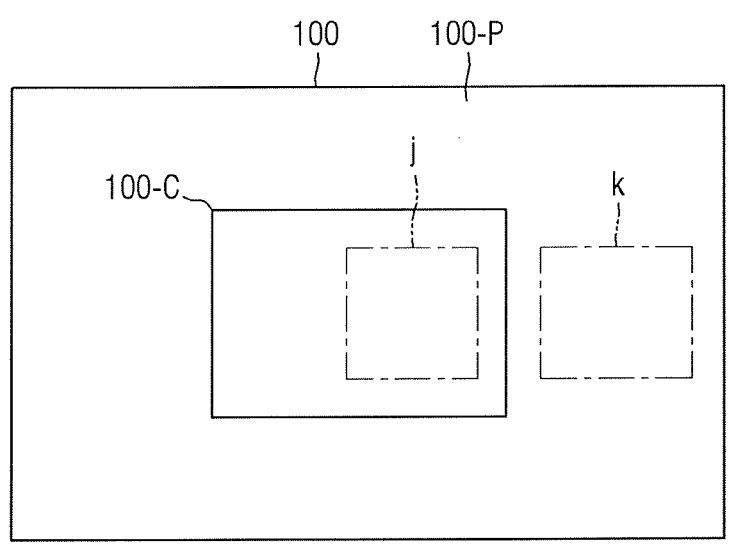
FIG. 1 is a plan view illustrating a semiconductor device according to an exemplary embodiment of the inventive concept.
Figure 2:
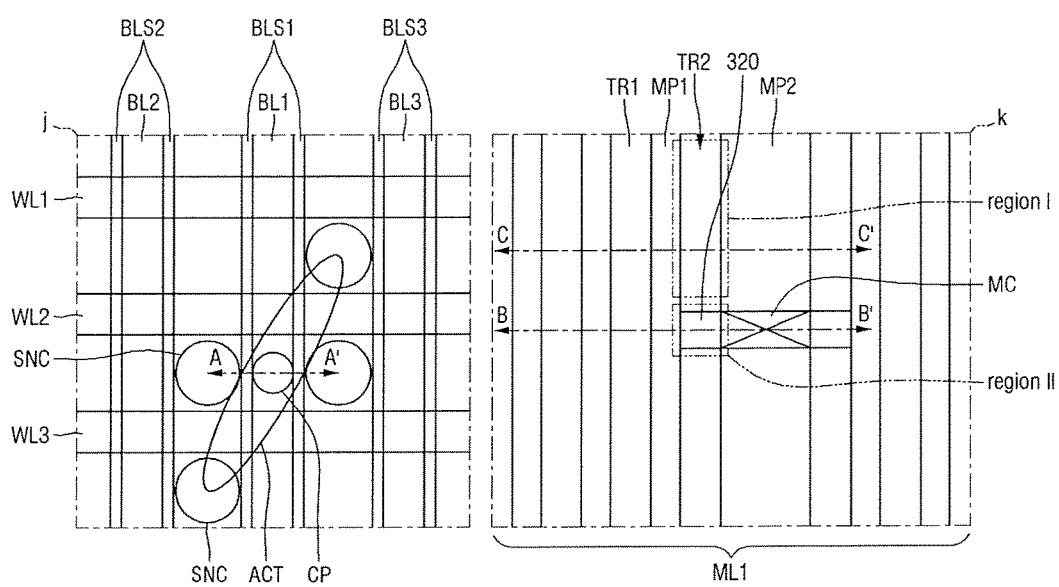
FIG. 2 is an enlarged plan view illustrating a region j and a region k of FIG. 1, according to an exemplary embodiment of the inventive concept.
Figure 3:
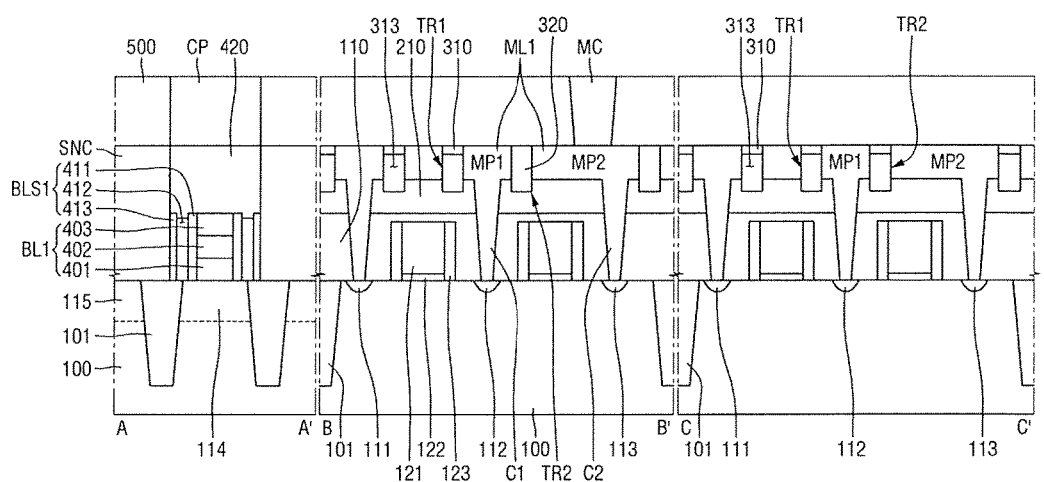
FIG. 3 is a cross-sectional view taken along lines A-A', B-B' and C-C' of FIG. 2, according to an exemplary embodiment of the inventive concept.

FIG. 1 is a plan view illustrating a semiconductor device according to an exemplary embodiment of the inventive concept. FIG. 2 is an enlarged plan view illustrating a region j and a region k of FIG. 1, according to an exemplary embodiment of the inventive concept. FIG. 3 is a cross-sectional view taken along lines A-A', B-B' and C-C' of FIG. 2, according to an exemplary embodiment of the inventive concept.

Referring to FIGS. 1 to 3, a substrate 100 of a semiconductor device may include a cell region 100-C and a peripheral circuit region 100-P. The peripheral circuit region 100-P may be disposed, for example, along at least a portion of the border of the cell region 100-C. For example, the peripheral circuit region 100-P may be disposed all around a border of the cell region 100-C. A capacitor and a metal-oxide semiconductor field-effect transistor (MOSFET) may be formed in the cell region 100-C. The MOSFET may be a memory cell transistor. Control elements for controlling the functions of transistors, and the like, may be formed in the peripheral circuit region 100-P.

The cell region 100-C may include a plurality of bit line structures BL1, BL2 and BL3 and a plurality of word line structures WL1, WL2 and WL3. The direction in which the plurality of bit line structures BL1, BL2 and BL3 extend and the direction in which the plurality of word line structures WL1, WL2 and WL3 extend may intersect each other. A plurality of bit line spacers BLS1, BLS2 and BLS3 may be disposed on both sidewalls of each of the plurality of bit line structures BL1, BL2 and BL3.

The first bit line structure BL1 may overlap with a contact pad CP. The contact pad CP may be disposed in an active region ACT. The contact pad CP may be disposed, for example, between the second word line structure WL2 and the third word line structure WL3. A storage node contact SNC may be disposed on both sides of the first bit line structure BL1. In addition, the storage node contact SNC can be disposed in the active region ACT.

The peripheral circuit region 100-P may include a first metal layer ML1. The first metal layer ML1 may include a plurality of wiring patterns (e.g., wire patterns) spaced apart from each other and a plurality of trenches disposed between the plurality of wiring patterns. A second wiring pattern MP2 of the first metal layer ML1 may be disposed on a side of a first wiring pattern MP1 of the first metal layer ML1. For example, a second trench TR2 may be disposed between the first wiring pattern MP1 and the second wiring pattern MP2 such that the first wiring pattern MP1 and the second wiring pattern MP2 may be spaced apart from each other.

The width of the first wiring pattern MP1 and the second wiring pattern MP2 may be different from each other. For example, the width of the second wiring pattern MP2, on which a third contact MC is disposed, may be larger than the width of the first wiring pattern MP1. Here, the width may be a value measured in a direction intersecting the direction in which the first wiring pattern MP1 and the second wiring pattern MP2 extend. However, the inventive concept is not limited thereto.

FIG. 2 shows only a portion (region k) of the peripheral circuit region 100-P, and the wiring patterns in another portion (region other than the region k in the peripheral circuit region 100-P) may have various widths. For example, in the second wiring pattern MP2, the width of a portion of the second wiring pattern MP2, where the third contact MC is disposed, may be different from the width of another portion of the second wiring pattern MP2, where the third contact MC is not disposed. Although the width of the first wiring pattern MP1 in the region k is illustrated as being constant, the inventive concept is not limited thereto. For example, a portion of the first wiring pattern MP1 where the third contact MC is formed may have a width larger than the width of a portion of the first wiring pattern MP1 in the region k. The third contact MC may be a contact that electrically connects an upper metal wiring to a lower metal wiring. The third contact MC will be described in detail below.

In the cross-sectional view of FIG. 3 taken along line B-B' of FIG. 2, the peripheral circuit region 100-P may include first to third impurity regions 111 to 113 disposed in the substrate 100, and a device isolation region 101.

The substrate 100 may be, for example, bulk silicon or silicon-on-insulator (SOI). Alternatively, the substrate 100 may be a silicon substrate, or may include other materials, such as silicon germanium, indium antimonide, a lead tellurium compound, indium arsenide, indium phosphide, gallium arsenide, and/or gallium antimonide. Alternatively, the substrate 100 may have an epitaxial layer formed on a base substrate.

The device isolation region 101 may include an insulating material. The first to third impurity regions 111 to 113 may be disposed on both sides of gate structures 121, 122 and 123, respectively. Each of the first to third impurity regions 111 to 113 may be, for example, a source/drain of a transistor.

A plurality of gate structures 121, 122 and 123 may be disposed on the substrate 100. The gate structures 121, 122 and 123 may be disposed between the first impurity region 111 and the second impurity region 112 and between the second impurity region 112 and the third impurity region 113. Each of the gate structures 121, 122 and 123 may include a gate electrode 121, a gate insulating film 122, and a gate spacer 123.

The gate insulating film 122 may be disposed between the gate electrode 121 and an upper surface of the substrate 100. The gate spacer 123 may be disposed on both sidewalls of the gate electrode 121 and the gate insulating film 122. Although it is illustrated in the drawings that the gate structures 121 to 123 include only the gate electrode 121, the gate insulating film 122, and the gate spacer 123, the inventive concept is not limited thereto. For example, the gate insulating film 122 may further include another insulating film disposed on a bottom surface of the gate electrode 121 and on both sidewalls of the gate electrode 121. Also, for example, the gate spacer 123 may have a multilayer structure.

A first interlayer insulating film 110 may be disposed on the substrate 100. The gate structures 121, 122 and 123 may be disposed in the first interlayer insulating film 110. The first interlayer insulating film 110 may include, for example, a low dielectric constant material, an oxide film, a nitride film and/or an oxynitride film to reduce a coupling phenomenon between wirings. For example, the low dielectric constant material may include flowable oxide (FOX), tonen silazen (TOSZ), undoped silica glass (USG), borosilica glass (BSG), phosphosilica glass (PSG), borophosphosilica glass (BPSG), plasma enhanced tetraethyl orthosilicate (PE-TEOS), fluoride silicate glass (FSG), carbon doped silicon oxide (CDO), xerogel, aerogel, amorphous fluorinated carbon, organo-silicate glass (OSG), parylene, bis-benzocyclobutenes (BCB), SiLK, polyimide, and/or a porous polymeric material, and/or a combination thereof. However, other materials that have a low dielectric constant may also be used.

A second interlayer insulating film 210 may be disposed on the first interlayer insulating film 110. The second interlayer insulating film 210 may include, for example, silicon nitride (SiN).

The first metal layer ML1 may be disposed on the second interlayer insulating film 210. A wiring pattern spacer 320 may be disposed between the first wiring pattern MP1 and the second wiring pattern MP2. The wiring pattern spacer 320 may be disposed on both sides of to the second wiring pattern MP2.

The wiring pattern spacer 320 may include a first insulating material. In an exemplary embodiment of the inventive concept, the first insulating material may include, for example, silicon nitride (SiN). The wiring pattern spacer 320 can electrically insulate the first wiring pattern MP1 from the second wiring pattern MP2. For example, the wiring pattern spacer 320 can insulate the second impurity region 112 and the third impurity region 113 from each other.

The second trench TR2 may be disposed between the first wiring pattern MP1 and the second wiring pattern MP2. Further, the second trench TR2 may be disposed between the second impurity region 112 and the third impurity region 113. A first sidewall of the second trench TR2 may be disposed adjacent to a sidewall of the second wiring pattern MP2. A second sidewall of the second trench TR2 may be disposed adjacent to a sidewall of the first wiring pattern MP1. The bottom surface of the second trench TR2 may be disposed adjacent to, for example, the second interlayer insulating film 210.

The second trench TR2 may include a first region (region I) and a second region (region II). The length of the first region (region I) may be longer than the length of the second region (region II). Here, the length may be a value measured along the direction in which the first wiring pattern MP1 and the second wiring pattern MP2 extend. The wiring pattern spacer 320 may be disposed in the second region (region II) of the second trench TR2. In the cross-sectional view of FIG. 3 taken along line C-C' of FIG. 2, a first air gap 313 and a first capping pattern 310 may be disposed in the first region (region I) of the second trench TR2. The second trench TR2 may electrically insulate the first wiring pattern MP1 from the second wiring pattern MP2.

A first trench TR1 may be disposed between the first impurity region 111 and the second impurity region 112. A first sidewall of the first trench TR1 may be disposed adjacent to a sidewall of the first wiring pattern MP1. A second sidewall of the first trench TR1, opposite to the first sidewall of the first trench TR1, may be disposed adjacent to a sidewall of another wiring pattern. The bottom surface of the first trench TR1 may be disposed adjacent to the second interlayer insulating film 210. The first trench TR1 may include the first capping pattern 310 and the first air gap 313.

The first trench TR1 may electrically insulate the first wiring pattern MP1 from another wiring pattern (for example, the second wiring pattern MP2).

The first capping pattern 310 may be spaced apart from the lower surface (e.g., the bottom surface) of the first trench TR1 and may cover the first trench TR1. The first capping pattern 310 may include, for example, the first insulating material.

The first air gap 313 may be formed in the first trench TR1 when the first capping pattern 310 is disposed apart from the lower surface of the first trench TR1. The first air gap 313 may be disposed between the lower surface of the first trench TR1 and the first capping pattern 310.

The first metal layer ML1 may be connected to the first to third impurity regions 111 to 113 through contacts passing through the first interlayer insulating film 110 and the second interlayer insulating film 210. The contacts passing through the first interlayer insulating film 110 and the second interlayer insulating film 210 may include a first contact C1 and a second contact C2.

The first contact C1 may extend from the first wiring pattern MP1 to the second impurity region 112. The first contact C1 may pass through the first interlayer insulating film 110 and the second interlayer insulating film 210. The first wiring pattern MP1 and the second impurity region 112 can be electrically connected by the first contact C1. The second contact C2 may extend from the second wiring pattern MP2 to the third impurity region 113. The second contact C2 may pass through the first interlayer insulating film 110 and the second interlayer insulating film 210. The second wiring pattern MP2 and the third impurity region 113 can be electrically connected by the second contact C2.

The third contact MC may be disposed on the second wiring pattern MP2. The third contact MC may be connected to the third impurity region 113 by the second wiring pattern MP2 and the second contact C2. The third contact MC may be disposed on a side of the second trench TR2. For example, the third contact MC may be disposed on a side of the second region (region II) of the second trench TR2. The wiring pattern spacer 320 may be disposed on both sides of the third contact MC. The third contact MC can connect the metal wiring formed on the first metal layer ML1 to the second wiring pattern MP2. The third contact MC may include, for example, a metal.

In an exemplary embodiment of the inventive concept, the wiring pattern spacer 320 may be disposed on both sides of a portion of the wiring pattern where the upper contact is disposed. The upper contact may refer to a contact, such as the third contact MC, connecting the metal wiring formed on (e.g., above) the first metal layer ML1 to the wiring pattern included in the first metal layer ML1. The first air gap 313 may be disposed on both sides of the other portion of the wiring pattern where the upper contact is not disposed.

A semiconductor device, according to an exemplary embodiment of the inventive concept, uses the first air gap 313, having a low dielectric constant, when electrically isolating the first wiring pattern MP1 from the second wiring pattern MP2. Thus, the parasitic capacitance that can be formed between the first wiring pattern MP1 and the second wiring pattern MP2 may be reduced. Further, a semiconductor device, according to an exemplary embodiment of the inventive concept, is configured such that the wiring pattern spacer 320 is disposed on both sides of a portion of the wiring pattern where the upper contact is disposed to minimize the parasitic capacitance that can be formed between the first wiring pattern MP1 and the second wiring pattern MP2. Thus, the yield of the semiconductor device can be increased.

In the cross-sectional view of FIG. 3 taken along line A-A' of FIG. 2, the substrate 100, in the active region ACT of the cell region 100-C, may include a fourth impurity region 114 and a fifth impurity region 115. The device isolation region 101 may be disposed between the fourth impurity region 114 and the fifth impurity region 115.

The first bit line structure BL1 may be disposed on the fourth impurity region 114 and may be electrically connected to the fourth impurity region 114. The first bit line structure BL1 may include a contact plug 401, a bit line 402, and an upper film 403. However, the inventive concept is not limited thereto. For example, the first bit line structure BL1 may include various components other than the bit line 402 when needed. The bit line 402 may be electrically connected to the fourth impurity region 114 through the contact plug 401.

The first bit line spacer BLS1 may be disposed on both sidewalls of the first bit line structure BL1. The first bit line spacer BLS1 may include a first spacer 411, a second air gap 412, and a third spacer 413.

The first spacer 411 may be disposed adjacent to the bit line 402. However, the inventive concept is not limited thereto, and another film may be formed between the first spacer 411 and the bit line 402. Although it is illustrated in the drawings that the first spacer 411 is located on the upper surface of the substrate 100 and has a straight shape, the inventive concept is not limited thereto. For example, the first spacer 411 may extend into the substrate 100. In addition, a portion of the first spacer 411 may be located in the fourth impurity region 114. In addition, the first spacer 411 may have, for example, an L shape.

The second air gap 412 may be disposed between the first spacer 411 and the third spacer 413. The second air gap 412 may be an empty space.

The third spacer 413 may be disposed between the second air gap 412 and the storage node contact SNC. Although it is illustrated in the drawings that the third spacer 413 is in direct contact with the storage node contact SNC, the inventive concept is not limited thereto. For example, another film may be formed between the third spacer 413 and the storage node contact SNC.

A second capping pattern 420 may be disposed on the first bit line structure BL1 and the first bit line spacer BLS1. A portion of a lower portion of the second capping pattern 420 may be inserted into the second air gap 412.

The storage node contact SNC may be disposed on the fifth impurity region 115 and may be electrically connected to the fifth impurity region 115. The storage node contact SNC may be disposed on the sidewall of the first bit line spacer BLS1. A lower electrode 500 of the capacitor may be disposed on the first bit line structure BL1. For example, the lower electrode 500 of the capacitor may be disposed on the storage node contact SNC. The storage node contact SNC may electrically connect the fifth impurity region 115 with the lower electrode 500 of the capacitor.

A method for fabricating a semiconductor device, according to an exemplary embodiment of the inventive concept, will be described with reference to FIGS. 1 to 13. It is to be understood that to the extent that elements of this figure are not described herein, they may be similar to or identical to corresponding elements that have already been described with respect to other figures.

FIGS. 4 to 21 are cross-sectional views illustrating a method for fabricating a semiconductor device according to exemplary embodiments of the inventive concept. FIGS. 4 to 21 illustrate cross-sections taken along lines A-A', B-B' and C-C' of FIG. 2. For example, FIGS. 4 to 13 illustrate a method for fabricating a semiconductor device according to an exemplary embodiment of the inventive concept.

Figure 4:
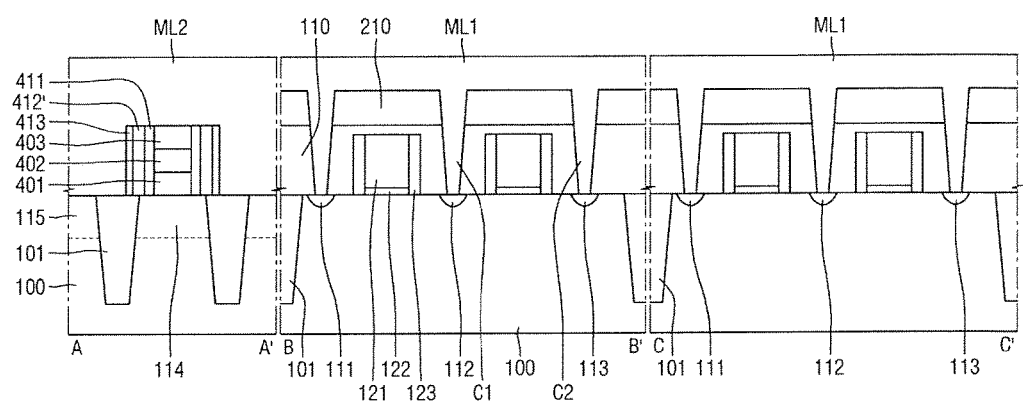
FIGS. 4 to 21 are cross-sectional views illustrating a method for fabricating a semiconductor device according to exemplary embodiments of the inventive concept.

Referring to FIGS. 1, 2 and 4, the first metal layer ML1 may be formed on the second interlayer insulating film 210 in the peripheral circuit region 100-P, and a second metal layer ML2 may be formed in the cell region 100-C.

The second interlayer insulating film 210 may be formed on the substrate 100 at the peripheral circuit region 100-P. The first metal layer ML1 may be formed on the second interlayer insulating film 210 of the peripheral circuit region 100-P to cover the second interlayer insulating film 210. The first metal layer ML1 may be connected to the first to third impurity regions 111 to 113.

The second metal layer ML2 may be formed in the cell region 100-C to cover the fifth impurity region 115, the device isolation region 101, the first bit line structure BL1 and the first bit line spacer BLS1. The first bit line spacer BLS1 may include a second spacer 412'. The second spacer 412' might not include the second air gap 412 (see FIG. 3). The second spacer 412' may include a material having an etch selectivity with respect to a material included in the first spacer 411 and the third spacer 413.

Figure 5:
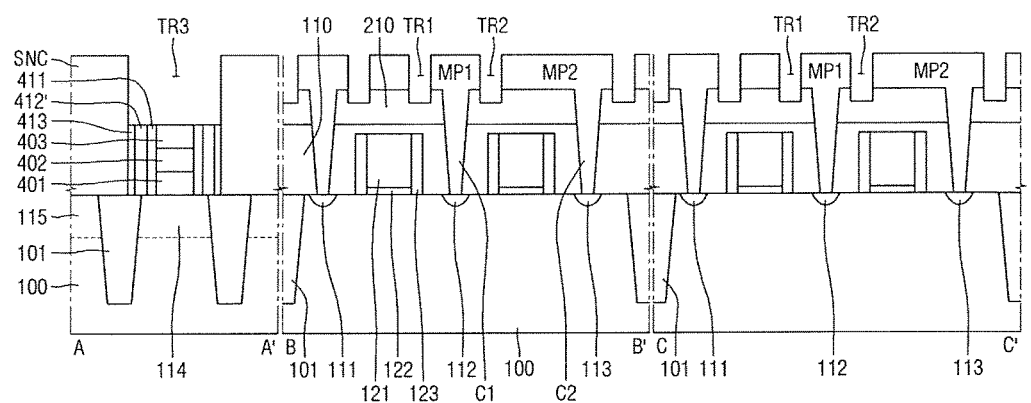

Referring to FIGS. 1, 2 and 5, the first trench TR1 and the second trench TR2 may be formed in the peripheral circuit region 100-P. A third trench TR3 may be formed in the cell region 100-C. The reference to a singular first trench TR1 may include a plurality of first trenches TR1, as illustrated in FIG. 5. In addition, the reference to a singular second trench TR2 may refer to a plurality of second trenches TR2, as illustrated in FIG. 5.

The first trench TR1 and the second trench TR2 may be formed in the first metal layer ML1 to pass through the first metal layer ML1. The first trench TR1 may expose the second interlayer insulating film 210. In an exemplary embodiment of the inventive concept, the first trench TR1 and the second trench TR2 may be formed to extend into the second interlayer insulating film 210. However, the first trench TR1 and the second trench TR2 might not pass through the second interlayer insulating film 210. Due to the formation of the first trench TR1 and the second trench TR2, the first wiring pattern MP1 and the second wiring pattern MP2 can be formed.

The third trench TR3 may be formed in the second metal layer ML2 by removing a portion of the second metal layer ML2. A portion of the second metal layer ML2 may be formed on the first bit line structure BL1 and the first bit line spacer BLS1. The third trench TR3 may expose at least a portion of the first bit line structure BL1 and the first bit line spacer BLS1. For example, the third trench TR3 may expose the second spacer 412'. Due to the formation of the third trench TR3, the storage node contact SNC can be formed.

Figure 6:
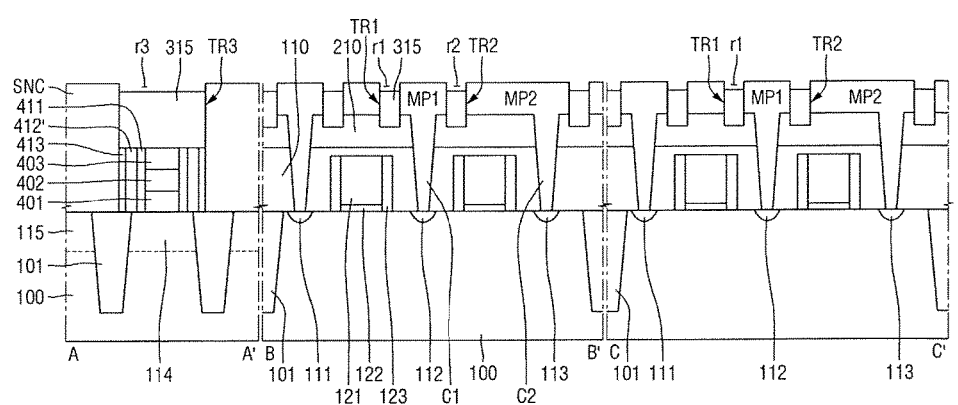

Referring to FIGS. 1, 2 and 6, a sacrificial pattern 315, a first recess r1 and a second recess r2 may be formed in the peripheral circuit region 100-P, and the sacrificial pattern 315 and a third recess r3 may be formed in the cell region 100-C.

The sacrificial pattern 315 may be formed to fill a portion of the first trench TR1, the second trench TR2 and the third trench TR3. The sacrificial pattern 315 may include a second insulating material. The second insulating material may be a material having an etch selectivity with respect to, for example, the first insulating material. The first metal layer ML1 and the second metal layer ML2 may include the first insulating material. The second insulating material may include, for example, an oxide.

The first to third recesses r1, r2 and r3 may be included in the first to third trenches TR1, TR2 and TR3, respectively. For example, the first to third recesses r1, r2 and r3 may be portions of the first to third trenches TR1, TR2 and TR3, respectively, which remain after the sacrificial pattern 315 is formed. Since the sacrificial pattern 315 fills only a portion of the first to third trenches TR1, TR2 and TR3, the remaining portion of the first to third trenches TR1, TR2 and TR3 may form the first to third recesses r1, r2 and r3.

Figure 7:
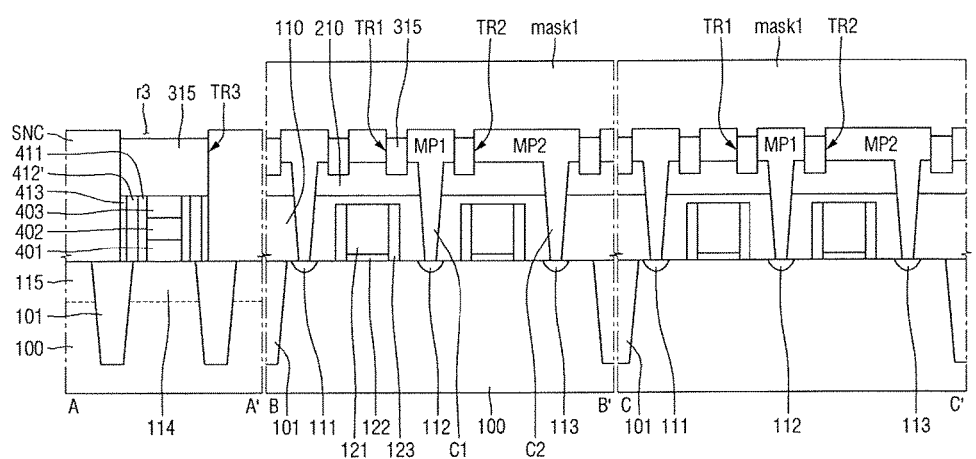

Referring to FIGS. 1, 2 and 7, a first mask pattern (mask 1) may be formed in the peripheral circuit region 100-P and the first mask pattern (mask 1) might not be formed in the cell region 100-C.

The first mask pattern (mask 1) may be formed on the first metal layer ML1 to cover the peripheral circuit region 100-P and to expose the cell region 100-C. The first mask pattern (mask 1) may be formed on the first metal layer ML1 to fill the first recess r1 and the second recess r2.

Figure 8:
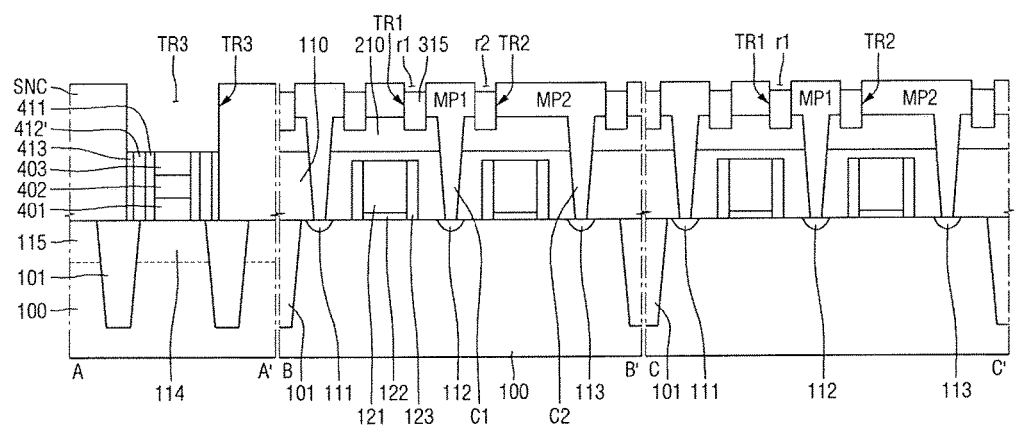

Referring also to FIG. 8, the sacrificial pattern 315, filling a portion of the third trench TR3, may be removed. For example, the sacrificial pattern 315 in the third trench TR3 may be selectively removed by using the first mask pattern (mask 1) as a mask. When the sacrificial pattern 315 in the third trench TR3 is removed, the second spacer 412' can be exposed again by the third trench TR3. The first mask pattern (mask 1) may be removed from the peripheral circuit region 100-P.

Figure 9:
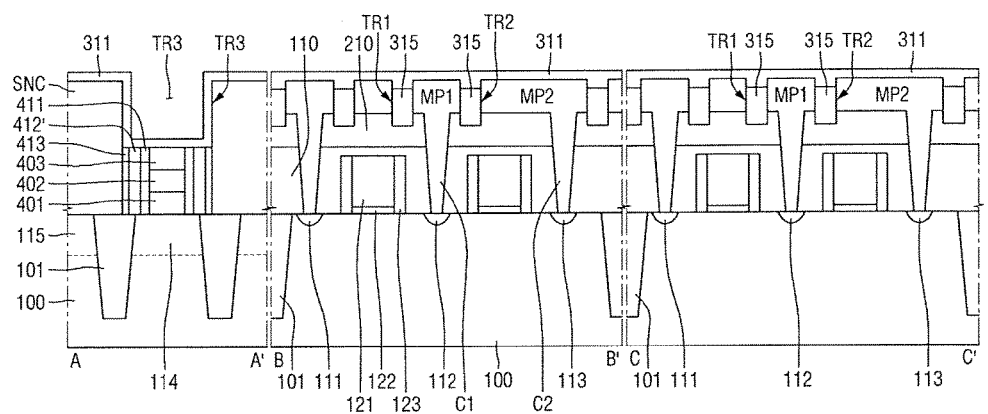

Referring to FIGS. 1, 2 and 9, a capping film 311 may be formed in the peripheral circuit region 100-P and in the cell region 100-C.

The capping film 311 may be formed on the first metal layer ML1 to fill the remaining portion of the first trench TR1 and the second trench TR2. The capping film 311 may also be formed on the sacrificial pattern 315 to fill the first recess r1 and the second recess r2. The capping film 311 may be formed on the storage node contact SNC. Further, the capping film 311 may be formed conformally along the sidewalls and the bottom surface of the third trench TR3. The capping film 311 might only fill a portion of the third trench TR3. For example, the capping film 311 might not fill the entire third trench TR3.

The capping film 311 may include a material having an etch selectivity with respect to the first metal layer ML1, the second metal layer ML2 and the sacrificial pattern 315. For example, the capping film 311 may include a second insulating material. The second insulating material may include, for example, silicon nitride (SiN).

Figure 10:
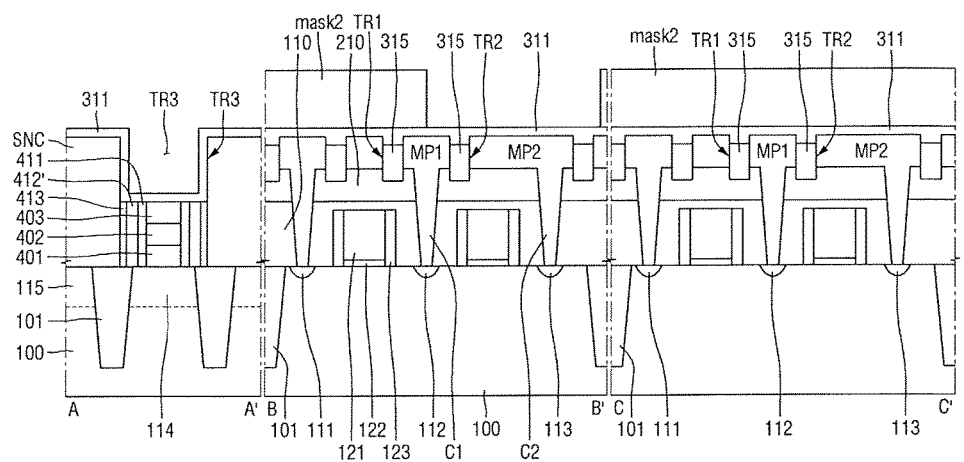

Referring to FIGS. 1, 2 and 10, a second mask pattern (mask 2) may be formed on the first metal layer ML1 to expose a portion of the capping film 311 formed on the cell region 100-C and the second region (region II) of the second trench TR2 of the peripheral circuit region 100-P. Further, the second mask pattern (mask 2) may expose a portion of the capping film 311 formed on the portion of the second wiring pattern MP2 in the second region H at the second trench TR2. For example, the second mask pattern (mask 2) may expose a portion of the capping film 311. In this case, the exposed portion of the capping film 311 is located at a portion (e.g., the second region (region II)) of the trench formed on both sides of a portion of the second wiring pattern MP2 on which the third contact MC (see FIG. 3) is to be formed in a subsequent process.

The second mask pattern (mask 2) may be formed on the first metal layer ML1 to cover a portion of the capping film 311 formed on the first region (region I) of the first trench TR1 and the second trench TR2.

Figure 11:
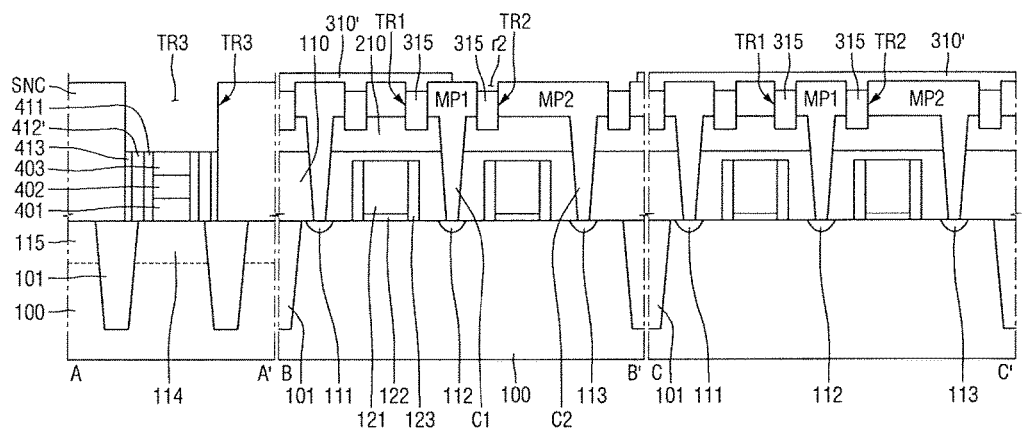

Referring to FIG. 11, the capping film 311 exposed by the second mask pattern (mask 2) may be selectively removed to form a first pre-capping pattern 310'. The selective removal of the capping film 311 may be performed by using the second mask pattern (mask 2) as a mask. Thereafter, the second mask pattern (mask 2) may be removed.

The first pre-capping pattern 310' may be formed on the sacrificial pattern 315 in the first trench TR1 and on the sacrificial pattern 315 in the first region (region I) of the second trench TR2.

As the capping film 311 exposed by the second mask pattern (mask 2) is removed, the sacrificial pattern 315, filling a portion of the second region II of the second trench TR2 and the second wiring pattern MP2, may be exposed. For example, the second recess r2 may be formed again in the second trench TR2. In addition, the second spacer 412' may be exposed again when the capping film 311, formed on the second metal layer ML2 and in the third trench TR3, is removed. The sacrificial pattern 315 formed in the first trench TR1, and the sacrificial pattern 315 formed in the first region (region I) of the second trench TR2, may be covered by the first pre-capping pattern 310'.

Referring to FIGS. 1, 2, 12 and 13, the first air gap 313 may be formed in the peripheral circuit region 100-P, and a fourth trench TR4 may be formed in the cell region 100-C.

The sacrificial pattern 315 in the second region (region II) of the second trench TR2 may be removed. Accordingly, an empty space may be formed in the second trench TR2. The sacrificial pattern 315 in the first trench TR1 and the sacrificial pattern 315 in the second region (region II) of the second trench TR2 may be selectively removed by using an etching gas, for example, through the second trench TR2. The sacrificial pattern 315, formed below the first pre-capping pattern 310', may be selectively removed using etch selectivity between the first pre-capping pattern 310' and the sacrificial pattern 315.

When the sacrificial pattern 315, formed below the first pre-capping pattern 310', is removed, the first air gap 313 can be formed. The first air gap 313 can be formed, for example, in the first trench TR1 and in the first region (region I) of the second trench TR2.

A second spacer 412' may include a material having no etch selectivity with respect to the sacrificial pattern 315. Therefore, the second spacer 412', exposed by the third trench TR3, can be removed. For example, the second spacer 412' can be selectively removed with the first and third spacers 411 and 413. Accordingly, the fourth trench TR4 can be formed between the first spacer 411 and the second spacer 412'. The selective removal of the second spacer 412' may be performed simultaneously with the removal of the sacrificial pattern 315 of the peripheral circuit region 100-P.

The second trench TR2 and the third trench TR3 may be filled with the first insulating material. In an exemplary embodiment of the inventive concept, a process of filling the second trench TR2 and a process of filling the third trench TR3 with the first insulating material can be performed simultaneously. The processes of filling the second trench TR2 and the third trench TR3 can be performed continuously until the first insulating material fills the second trench TR2 and the third trench TR3. By filling the second trench TR2 with the first insulating material, the wiring pattern spacer 320 can be formed. By filling the third trench TR3 with the first insulating material, the second capping pattern 420 can be formed.

The first insulating material may be, for example, a material having poor gap fill characteristics. Since the gap fill characteristics of the first insulating material may be poor, the first insulating material can cover only the upper surface of the fourth trench TR4 without filling the entirety of the fourth trench TR4 during the filling process. Thus, a portion of the second capping pattern 420 may be inserted into the fourth trench TR4 to fill a portion of the fourth trench TR4. When a portion of the second capping pattern 420 is formed to be spaced apart from the lower surface of the fourth trench TR4, the second air gap 412 may be formed in the fourth trench TR4.

However, the inventive concept is not limited thereto. For example, depending on the filling process, a portion of the second capping pattern 420 might not be inserted into the fourth trench TR4. For example, the shape of the second capping pattern 420 is not limited to that shown in the drawings as long as the upper surface of the fourth trench TR4 is covered to form an empty space (e.g., the second air gap 412) in the fourth trench TR4.

The first pre-capping pattern 310' may be etched back until the upper surface of the first metal layer ML1 is exposed. Accordingly, the first capping pattern 310 can be formed.

Since the first capping pattern 310 is spaced apart from the lower surface of the first trench TR1 and the first region (region I) of the second trench TR2, the first air gap 313 may be an empty space formed in the first region TR1 and the first region (region I) of the second trench TR2.

Referring to FIGS. 1, 2 and 3, the third contact MC may be formed in the peripheral circuit region 100-P. The third contact MC may be formed on a side of the wiring pattern spacer 320. Further, the third contact MC may be formed on the second wiring pattern MP2.

In the cell region 100-C, the lower electrode 500 may be formed on the storage node contact SNC. The lower electrode 500 may be one of the electrodes of a capacitor in a subsequent process.

FIGS. 14 to 21 illustrate a method for fabricating a semiconductor device according to an exemplary embodiment of the inventive concept. Omitted elements or processes can be understood to be similar or identical to corresponding elements or processes already disclosed.

Figure 14:
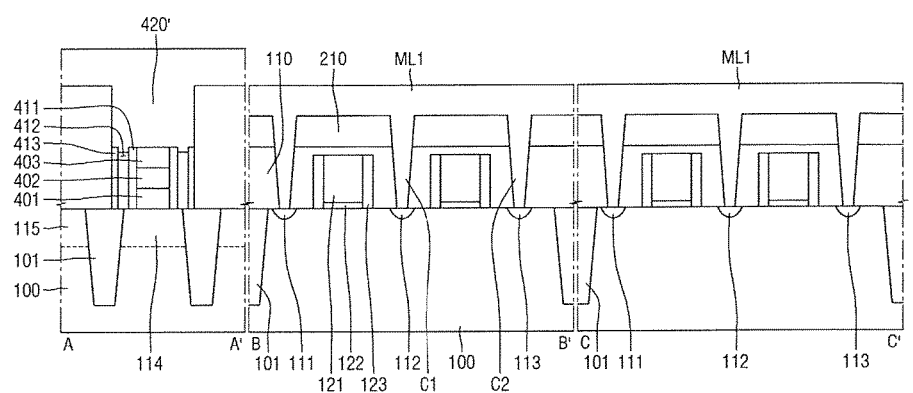

Referring to FIGS. 1, 2 and 14, in the peripheral circuit region 100-P, the first metal layer ML1 may be formed on the second interlayer insulating film 210. The storage node contact SNC, the second air gap 412 and a second pre-capping pattern 420' may be formed in the cell region 100-C.

In an exemplary embodiment of the inventive concept, the second air gap 412 of the cell region 100-C may be formed before the first metal layer ML1 is formed in the peripheral circuit region 100-P.

Figure 12:
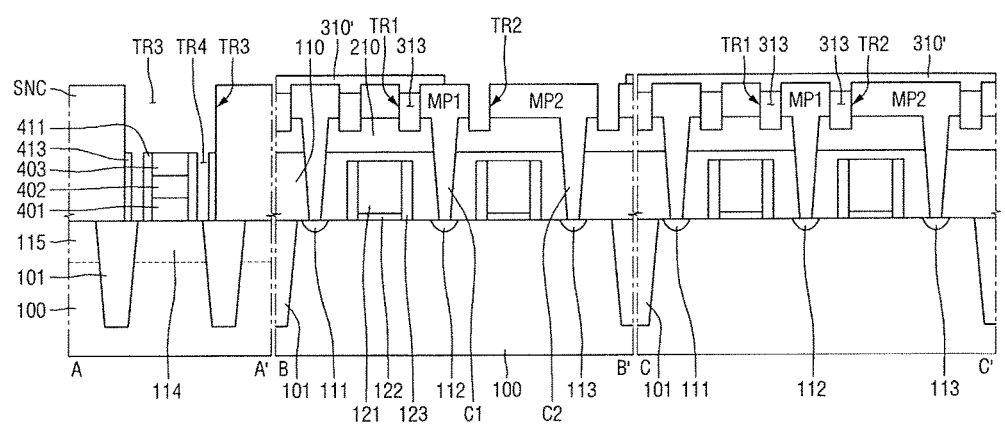
Figure 13:
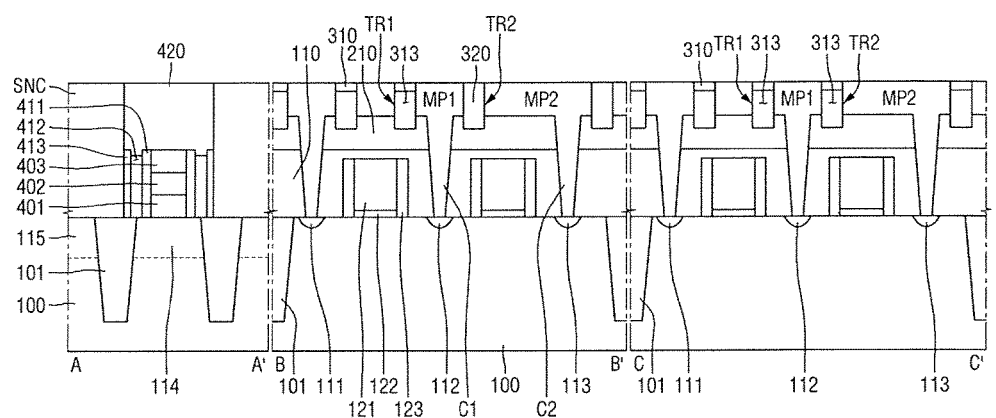

A lower portion of the second pre-capping pattern 420' may have the same shape as the shape of the lower portion of the second capping pattern 420 described with reference to FIGS. 12 and 13. The second pre-capping pattern 420' may also be formed on the storage node contact SNC.

Figure 15:
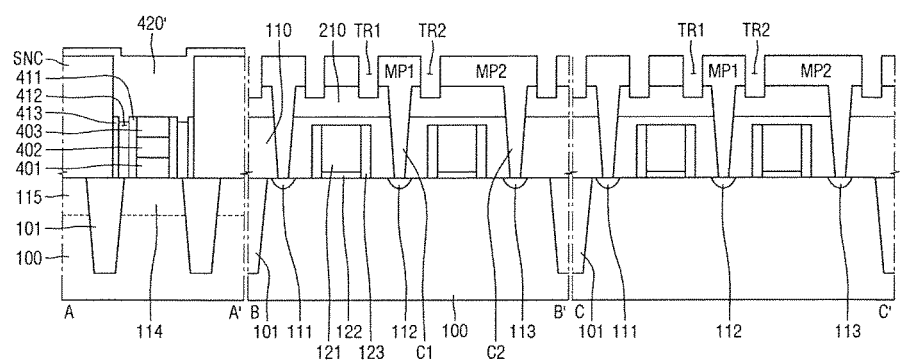

Referring to FIGS. 1, 2 and 15, the first trench TR1 and the second trench TR2 may be formed in the peripheral circuit region 100-P.

In an etching process for forming the first trench TR1 and the second trench TR2, a recess may be formed on the upper surface of the second pre-capping pattern 420'. For example, in the etching process for forming the first trench TR1 and the second trench TR2, by removing a portion of the upper surface of the second pre-capping pattern 420', the upper surface of the second pre-capping pattern 420' might not be flat. The bottom surface of the recess formed on the upper surface of the second pre-capping pattern 420' may be on the same plane as the upper surface of the storage node contact SNC, or may be higher than the upper surface of the storage node contact SNC when measured perpendicularly from the upper surface of the substrate 100.

Figure 16:
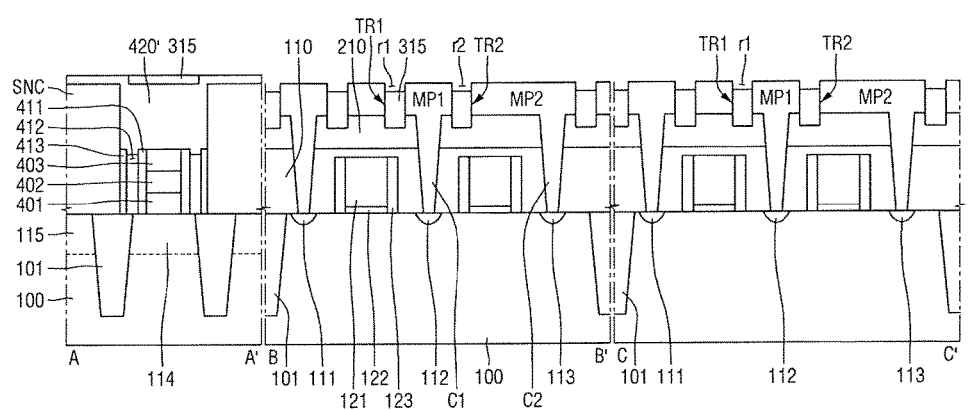

Referring to FIGS. 1, 2 and 16, the sacrificial pattern 315, the first recess r1 and the second recess r2 may be formed in the peripheral circuit region 100-P. The sacrificial pattern 315 may be formed on the second pre-capping pattern 420' in the cell region 100-C.

When the sacrificial pattern 315 is formed in the peripheral circuit region 100-P, the sacrificial pattern 315 may also be formed in a portion of the upper surface of the second pre-capping pattern 420', etched in the etching process for forming the first trench TR1 and the second trench TR2. For example, the sacrificial pattern 315 may be formed in the recess formed on the upper surface of the second pre-capping pattern 420'.

Figure 17:
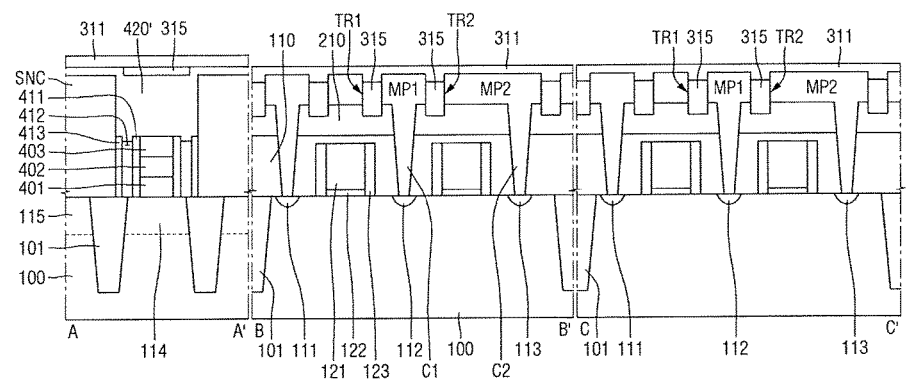

Referring to FIGS. 1, 2 and 17, the capping film 311 may be formed in the peripheral circuit region 100-P and the cell region 100-C.

In the case of the cell region 100-C, the capping film 311 may be formed on the second pre-capping pattern 420' and the sacrificial pattern 315. In the case of the peripheral circuit region 100-P, as described with reference to FIG. 9, the capping film 311 may be formed on the first metal layer ML1 and the sacrificial pattern 315 to fill the first recess r1 and the second recess r2. In the case of FIG. 17, the steps of FIGS. 7 and 8 may be omitted. For example, when the second air gap 412 is already formed in the cell region 100-C before the formation of the first trench TR1 and the second trench TR2, the steps of FIGS. 7 and 8 may be omitted.

Figure 18:
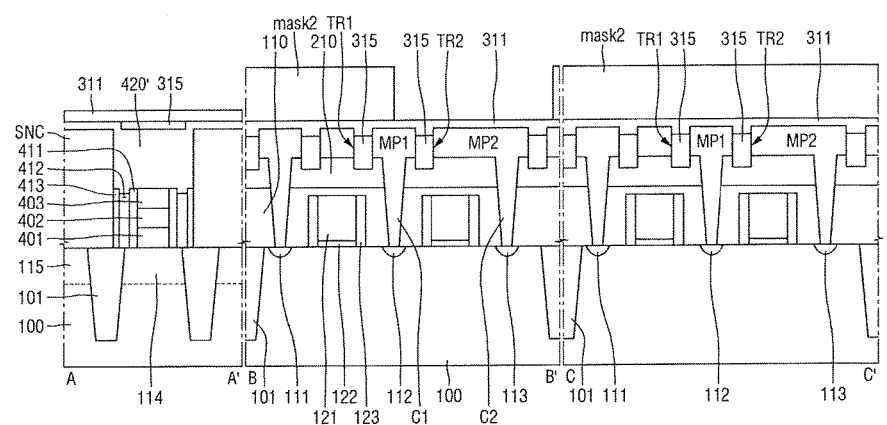

Referring to FIGS. 1, 2 and 18, the second mask pattern (mask 2) may be formed on the first metal layer ML1 to expose a portion of the capping film 311 in the cell region 100-C and the second region (region II) of the second trench TR2 in the peripheral circuit region 100-P. Further, the second mask pattern (mask 2) may expose a portion of the capping film 311 at the portion of the second wiring pattern MP2 disposed on a side of the second region II of the second trench TR2.

Figure 19:
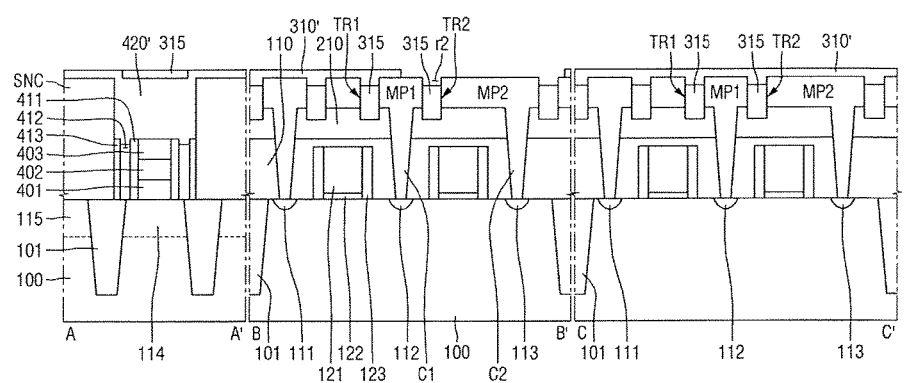
Figure 20:
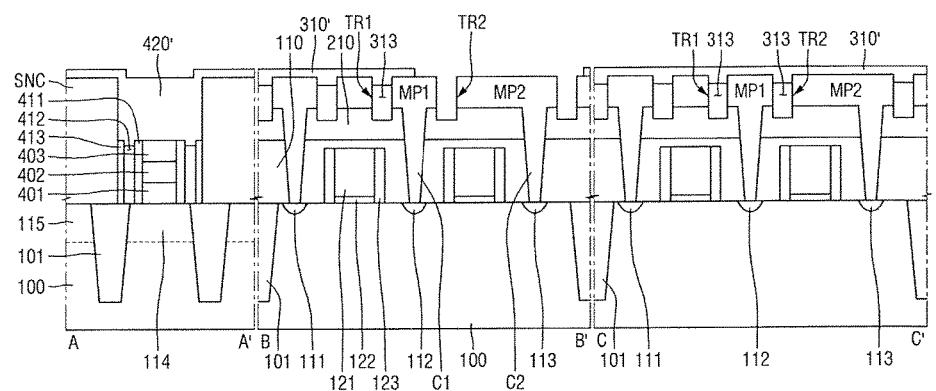
Figure 21:
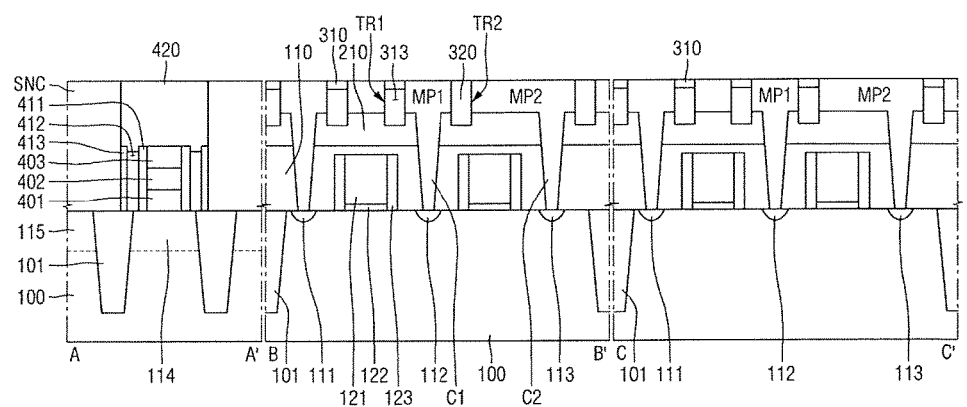

Referring to FIG. 19, the capping film 311, exposed by the second mask pattern (mask 2), may be selectively removed to form the first pre-capping pattern 310'. A portion of the capping film 311 formed in the cell region 100-C may be removed so that the upper surface of the second pre-capping pattern 420' and the sacrificial pattern 315 can be exposed.

Referring to FIGS. 1, 2, 20 and 21, the first air gap 313 may be formed in the peripheral circuit region 100-P, and the sacrificial pattern 315 of the cell region 100-C may be removed.

The second trench TR2 may be filled with the first insulating material. Thus, the wiring pattern spacer 320 can be formed in the second trench TR2.

The second pre-capping pattern 420' may be etched back until the upper surface of the storage node contact SNC is exposed. Accordingly, the second capping pattern 420 may be formed.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A method for fabricating a semiconductor device, comprising:

providing a substrate including a cell region and a peripheral circuit region, wherein the cell region includes a bit line structure, a bit line spacer formed on both sidewalls of the bit line structure and a lower electrode formed on the bit line structure, wherein the peripheral circuit region is disposed at least partially along a border of the cell region, and wherein the peripheral circuit region includes a first impurity region, a second impurity region and a third impurity region;

forming an interlayer insulating film on the peripheral circuit region of the substrate;

forming a first metal layer on the interlayer insulating film, wherein the first metal layer is connected to the first impurity region, the second impurity region, and the third impurity region;

forming a first trench and a second trench in the first metal layer, wherein the first trench is disposed between the first and second impurity regions and exposes the interlayer insulating film, and the second trench is disposed between the second and third impurity regions and exposes the interlayer insulating film;

forming a first capping pattern on the first trench, wherein the first capping pattern is spaced apart from a bottom surface of the first trench forming a first air gap in the first trench;

filling the second trench with a first insulating material insulating the second and third impurity regions; and forming, on the first metal layer, a contact connected to the third impurity region, wherein the contact is formed at a first side of the second trench, and wherein the first trench is formed at a second side of the second trench, the first and second sides of the second trench being opposite to each other.

2. The method of claim 1, wherein the forming of the first capping pattern comprises:

filling a portion of the first and second trenches with a second insulating material;

forming the first capping pattern on the second insulating material to fully fill the first trench; and selectively removing the second insulating material from the first and second trenches.

3. The method of claim 2, wherein the forming of the first capping pattern on the second insulating material to fully fill the first trench comprises:

filling a portion of the first and second trenches with the second insulating material and then forming a capping film on the first metal layer such that the capping film fully fills the first and second trenches;

forming a first mask pattern on the first trench to expose a portion of the capping film on the second trench;

forming a pre-capping pattern by selectively removing a portion of the capping film on the second trench by using the first mask pattern as a mask;

removing the first mask pattern; and forming the first capping pattern by etching back the pre-capping pattern until an upper surface of the first metal layer is exposed.

4. The method of claim 1, wherein the first and second trenches extend into the interlayer insulating film.

5. The method of claim 1, wherein the cell region of the substrate includes a fourth impurity region and a fifth impurity region, wherein the bit line structure is connected to the fourth impurity region, and wherein the bit line spacer includes a first spacer and a second spacer having an etch selectivity with respect to the first spacer, the method further comprising:

forming a second metal layer in the cell region of the substrate such that the second metal layer covers the bit line structure and the bit line spacer;

forming a third trench in the second metal layer exposing the first spacer and forming a storage node contact, wherein the storage node contact is connected to the fifth impurity region;

selectively removing the first spacer, exposed by the third trench, to form a fourth trench in the bit line spacer;

forming a second capping pattern, wherein the second capping pattern covers the fourth trench and fills the third trench such that a second air gap is formed in the fourth trench; and forming the lower electrode on the storage node contact, wherein the third trench is formed simultaneously with the first and second trenches.

6. The method of claim 5, wherein the forming of the first capping pattern comprises:

filling a portion of the first to third trenches with a second insulating material;

forming a first mask pattern covering the first and second trenches and exposing the third trench;

exposing the first spacer by selectively removing the second insulating material, the second insulating material filling a portion of the third trench, by using the first mask pattern as a mask;

forming the first capping pattern on the second insulating material of the peripheral circuit region to fully fill the first trench; and selectively removing the second insulating material, the second insulating material filling a portion of the first and second trenches, by using an etch selectivity between the second insulating material and the first capping pattern, wherein the selectively removing of the second insulating material, which fills a portion of the first and second trenches, is performed simultaneously with the forming of the fourth trench.

7. The method of claim 6, wherein the exposing of the first spacer by selectively removing the second insulating and the forming of the first capping pattern on the second insulating material to fully fill the first trench comprises:

forming a capping film on the first and second metal layers to fill a portion of the third trench and to fully fill the first and second trenches;

forming a second mask pattern on the first trench to expose a portion of the capping film in the second trench and the third trench; and removing a portion of the capping film in the second trench and the third trench by using the second mask pattern as a mask.

8. The method of claim 1, wherein the cell region of the substrate includes a fourth impurity region and a fifth impurity region, wherein the bit line structure is connected to the fourth impurity region, and wherein the bit line spacer includes a first spacer and a second spacer having an etch selectivity with respect to the first spacer, the method further comprising:
before the forming of the first and second trenches, forming a second metal layer on the cell region of the substrate to cover the bit line structure and the bit line spacer;
forming a third trench in the second metal layer exposing the first spacer and forming a storage node contact, wherein the storage node contact is connected to the fifth impurity region;
selectively removing the first spacer, exposed by the third trench, forming a fourth trench in the bit line spacer;
forming a second capping pattern, the second capping pattern covering the fourth trench and filling the third trench, forming a second air gap in the fourth trench; and
forming the lower electrode on the storage node contact.

9. A method for fabricating a semiconductor device, comprising:
providing a substrate including a cell region and a peripheral circuit region, wherein the cell region includes a bit line structure, a bit line spacer formed on both sidewalls of the bit line structure and a lower electrode formed on the bit line structure, wherein the peripheral circuit region is disposed at least partially along a border of the cell region, and wherein the peripheral circuit region includes a first impurity region, and a second impurity region therein;
forming an interlayer insulating film on the peripheral circuit region of the substrate;
forming a first wire pattern connected to the first impurity region and a second wire pattern connected to the second impurity region, the first wire pattern and the second wire pattern being spaced apart from each other on the interlayer insulating film;
forming a first trench exposing the interlayer insulating film between the first and second wire patterns, the first trench including a first region and a second region;
forming a first capping pattern covering the first region of the first trench, wherein the first capping pattern is spaced apart from a bottom surface of the first trench such that a first air gap is formed in the first region of the first trench;
filling the second region of the first trench with a first insulating material; and
forming a contact on the second wire pattern, wherein the contact is connected to the second impurity region on a first side of the second region of the first trench, wherein the second region of the first trench is filled with the first insulating material.

10. The method of claim 9, wherein the forming of the first capping pattern comprises:
filling a portion of the first and second regions of the first trench with a second insulating material;
forming the first capping pattern on the second insulating material such that the first capping pattern fully fills the first region of the first trench; and
selectively removing the second insulating material from the first and second regions of the first trench.

11. The method of claim 10, wherein the forming of the first capping pattern on the second insulating material comprises:
filling a portion of the first and second regions of the first trench with the second insulating material;
forming a capping film on the second insulating material and the first and second wire patterns fully filling the first trench;
forming a mask pattern on the first trench exposing a portion of the capping film formed on the second region of the first trench;
forming a pre-capping pattern by selectively removing a portion of the capping film from the second region of the first trench by using the mask pattern as a mask;
removing the mask pattern; and
etching back the pre-capping pattern until an upper surface of each of the first and second wire patterns is exposed.

12. The method of claim 9, wherein the first trench extends into the interlayer insulating film.

13. The method of claim 9, wherein a length of the first region is longer than a length of the second region, and
wherein the length of the first and second regions is measured along a direction in which the first and second wire patterns extend.

14. The method of claim 9, wherein the cell region of the substrate includes a third impurity region and a fourth impurity region,
wherein the bit line structure is connected to the third impurity region, and
wherein the bit line spacer includes a first spacer and a second spacer having an etch selectivity with respect to the first spacer,
the method further comprising:
forming a metal layer on the cell region of the substrate to cover the bit line structure and the bit line spacer;
forming a second trench in the metal layer to expose the first spacer and forming a storage node contact, wherein the storage node contact is connected to the fourth impurity region;
selectively removing the first spacer, exposed by the second trench, forming a third trench in the bit line spacer;
forming a second capping pattern, the second capping pattern covering the third trench and filling the second trench, forming a second air gap in the third trench; and
forming the lower electrode on the storage node contact,
wherein the third trench is formed simultaneously with the first and second trenches.

15. The method of claim 9, wherein the cell region of the substrate includes a third impurity region and a fourth impurity region,
wherein the bit line structure is connected to the third impurity region, and
wherein the bit line spacer includes a first spacer and a second spacer having an etch selectivity with respect to the first spacer, the method further comprising:
before forming the first trench, forming a metal layer on the cell region of the substrate covering the bit line structure and the bit line spacer;
forming a second trench in the metal layer exposing the first spacer to form a storage node contact, wherein the storage node contact is connected to the fourth impurity region;
selectively removing the first spacer, exposed by the second trench, forming a third trench in the bit line spacer;
forming a second capping pattern, the second capping pattern covering the third trench and filling the second trench, forming a second air gap in the third trench; and
forming the lower electrode on the storage node contact.

16. A method for fabricating a semiconductor device, comprising:
providing a substrate including a cell region and a peripheral circuit region, wherein the cell region includes a bit line structure, a first bit line spacer and a second bit line spacer formed on opposite sidewalls of the bit line structure, and a first electrode formed on the bit line structure, wherein the peripheral circuit region is disposed at least partially along a border of the cell region, and wherein the peripheral circuit region includes a first impurity region, and a second impurity region therein;

forming an interlayer insulating film on the peripheral circuit region of the substrate;

forming a first metal layer on the interlayer insulating film, wherein the first metal layer is connected to the first impurity region and the second impurity region;

forming a first wire pattern on the interlayer insulating film, the first wire pattern being connected to the first impurity region;

forming a second wire pattern on the interlayer insulating film, the second wire pattern being connected to the second impurity region, wherein the first and second wire patterns are spaced apart from each other;

forming a first trench between the first and second wire patterns, the first trench exposing the interlayer insulating film, the first trench including a first region and a second region;

forming a first capping pattern on the first region of the first trench to cover the first region of the first trench, wherein the first capping pattern is partially inserted at an opening of the first region of the first trench such that an empty space is formed between a bottom surface of the first region of the first trench and the partially inserted first capping pattern;

filling the second region of the first trench with a first insulating material; and forming a contact on the second wire pattern, wherein the contact is connected to the second impurity region on a first side of the second region of the first trench, wherein the second region of the first trench is filled with the first insulating material.

17. The method of claim 16, wherein a length of the second region of the first trench is shorter than a length of the first region of the first trench.

18. The method of claim 16, wherein a width of the first wire pattern is different from a width of the second wire pattern.

19. The method of claim 16, wherein the first insulating material includes silicon nitride (SiN).

20. The method of claim 16, further comprising a third impurity region in the cell region, wherein the bit line structure contacts the third impurity region.

* * * * *